(12) United States Patent
Schultheiss et al.

(10) Patent No.: US 6,771,139 B2
(45) Date of Patent: Aug. 3, 2004

(54) MICROWAVE PULSE GENERATOR

(75) Inventors: Daniel Schultheiss, Homberg (DE); Winfried Rauer, Fischerbach (DE)

(73) Assignee: VEGA Grieshaber KG, Wolfach (DE)

( * ) Notice: Subject to any disclaimer, the term of this patent is extended or adjusted under 35 U.S.C. 154(b) by 99 days.

(21) Appl. No.: 10/300,844

(22) Filed: Nov. 21, 2002

(65) Prior Publication Data
US 2004/0032301 A1 Feb. 19, 2004

(30) Foreign Application Priority Data
Jul. 24, 2002 (DE) .......................... 102 33 569

(51) Int. Cl.$^7$ .............................. H03B 5/18
(52) U.S. Cl. .............. 331/172; 331/99; 331/117 FE; 331/117 D; 331/175
(58) Field of Search .............. 331/47, 55, 96, 331/99, 100, 108 R, 117 R, 117 FE, 117 D, 172, 173, 175

(56) References Cited

U.S. PATENT DOCUMENTS 4,755,772 A   7/1988 Khanna
6,252,470 B1   6/2001 Togawa
6,380,815 B1 * 4/2002 Fehrenbach et al. .......... 331/99

FOREIGN PATENT DOCUMENTS

| DE | 197 02 261 C2 | 7/1998 |
| DE | 198 00 459 | 7/1999 |
| DE | 100 41 331 | 5/2002 |
| EP | 0 320 175 | 6/1989 |
| RU | 2 013 000 | 5/1994 |
| SU | 663 080 | 5/1979 |
| WO | WO 96/07931 | 3/1996 |

* cited by examiner

Primary Examiner—David Mis
(74) Attorney, Agent, or Firm—Gary M. Nath; Nath & Associates PLLC

(57) ABSTRACT

The microwave pulse generator of the invention for generating microwave pulses with a pulse duration in the nanosecond range has a pulse generator that generates pulses of constant width, and a microwave resonant circuit for generating microwave oscillations. Additionally provided is a pulse-shortening stage, to which the pulses from the pulse generator are fed and which generates output pulses in the nanosecond range. The output pulses are fed as supply voltage pulses to a microwave oscillator, at the output of which the microwave pulses can be picked off. A voltage-controlled varicap diode arrangement is provided to influence the pulse lengths and/or pulse amplitudes.

16 Claims, 6 Drawing Sheets

MICROWAVE PULSE GENERATOR

The invention pertains to a microwave pulse generator for generating microwave pulses in the nanosecond range according to the characteristics of the preamble of Claim 1.

Such microwave pulse generators are customarily employed for precise distance measurement in radar systems, particularly pulse radar systems.

Such microwave pulse generators are described in, for instance, DE 197 02 261 C2. The microwave pulse generators there have the advantage that the circuitry expense is considerably reduced in comparison to other microwave pulse generators by generating pulses of a suitable duration that are provided for the voltage supply of a microwave oscillator. Moreover, the known arrangement does not require any expensive charge-coupled diodes. The pulse in the nanosecond range, which determines the duration of the actual microwave pulse, can be generated by a simple pulse-shortening stage.

In a refinement, the coupling of pulse-shortening stage and oscillator can be improved by a driver stage and/or a decoupling stage. Should the pulse-shortening stage be constructed such that it generates an inverted output signal, this can be compensated by an inverting driver stage. The decoupling stage can advantageously be implemented by a circular stub.

Figure 1:
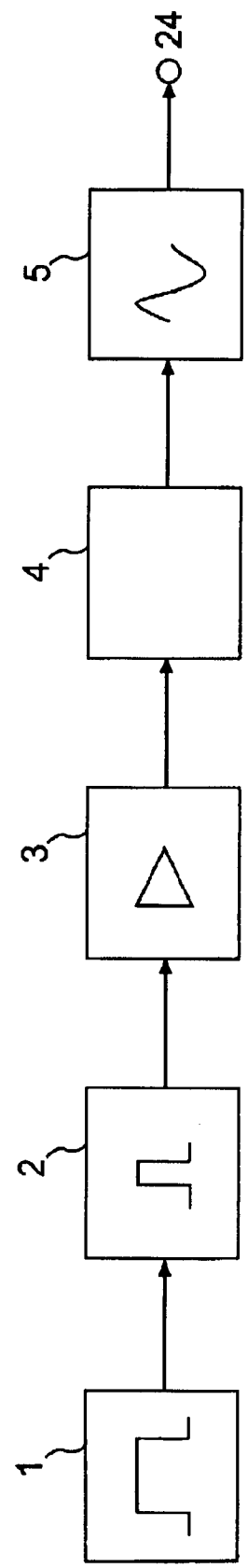

The microwave pulse generator from DE 197 02 261 C2 will be explained further on the basis of three figures. In FIG. 1, a pulse generator, of which the output signal is fed to a pulse-shortening stage 2, is designated 1. Pulse-shortening stage 2 generates pulses in the nanosecond range, which are fed to the input of a driver stage 3. The signal amplified by driver stage 3 is fed to a decoupling network 4, which is connected at its output end to the supply input of a microwave oscillator 5. The output signal of microwave oscillator 5 can be picked off at an output terminal 24.

The pulse generator supplies a pulse train with a predetermined pulse period. According to FIG. 2, downstream pulse-shortening stage 2 can have an input terminal 6, which is connected via a resistor 7 to the base of an npn transistor 11 and via a resistor 8 to the base of an npn transistor 10. A capacitor 9 between resistor 8 and the base of transistor 10 is connected to ground. The collector of transistor 10 is connected to the base of transistor 11, and the emitter of transistor 10 is connected to ground. The emitter of transistor 11 is likewise connected to ground. The collector of transistor 11 forms the output circuit of the pulse-shortening stage and is coupled to the input circuit of downstream driver stage 3. For this purpose, the collector is connected to supply voltage terminal 17 via series circuit consisting of three resistors 12, 13 and 16. The center tap of the series circuit of resistors 12 and 13 is connected to the base of pnp transistor 18 and the center tap of the series circuit of resistors 13 and 16 is connected to the emitter of transistor 18. Its collector is connected to an output terminal 19. Resistor 16 is connected to ground at both ends via decoupling capacitors 15 and 16.

Figure 3:
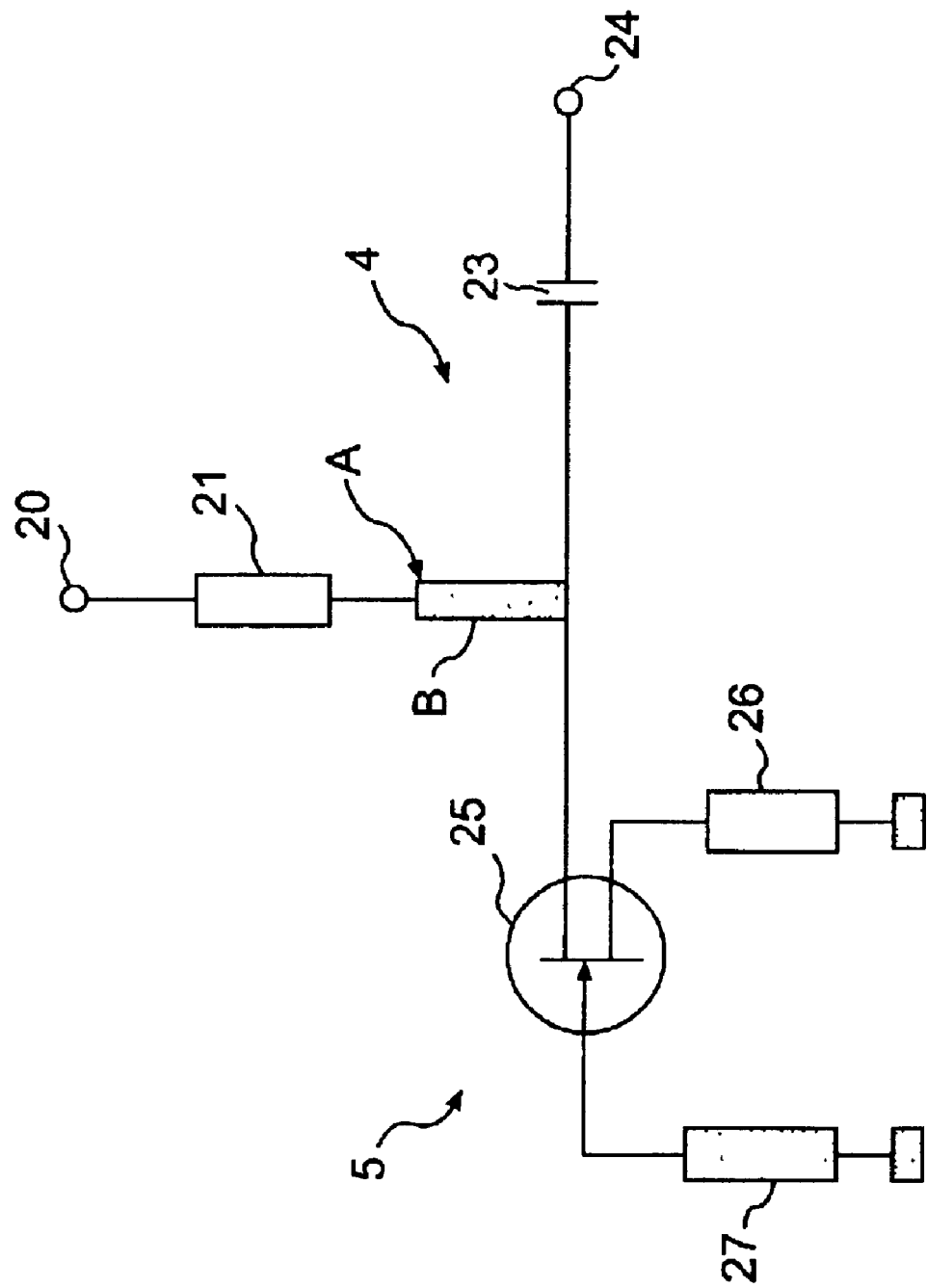

According to FIG. 3, the microwave oscillator has a supply terminal 20. The latter is connected via a resistor 21 to a circular stub A and a λ/4 line B. At its output end, λ/4 line B is wired to output terminal 24 via a capacitor 23 and is connected to ground via the load path of a field-effect transistor 25 and a resistor 26 connected in series thereto. The gate terminal of field-effect transistor 25 is connected to ground via an inductor 27.

Output 19 of driver stage 3 is connected to supply terminal 20. A pulse train with a predetermined period is supplied to input terminal 6. The incoming pulse from pulse generator 1 is shortened in pulse-shortening stage 2 to length $t_p$. This is done in the embodiment of FIG. 2 by virtue of the fact that the positive edge of the incoming pulse switches transistor 11 into the conductive state upon exceeding its base-emitter potential. Thereby, voltage divider 12, 13, 16 is powered and thus sufficient voltage is dropped across resistor 13 to switch transistor 18 into the conductive state. At the same time, the positive edge of the incoming pulse is delayed via RC element 8, 9 by the time defined by it. By selecting the fast transistor appropriately, this delay time can be adjusted from fractions of a nanosecond to the length of the incoming pulse. After this delay time has elapsed, transistor 10 is switched to become conductive, so that the voltage at the base of transistor 11 is reduced to the saturation potential of transistor 10. Transistor 11 thus returns to the high-ohmic state and thereby also blocks transistor 18. Accordingly, a short pulse of length $t_p$ is available at output 19 and can moreover be loaded low-ohmically. Network 14, 15, 16 serves only to block the operating voltage that is applied to terminal 17. Pulse-shortening stage 2 and driver stage 3 complement one another in the present example by each inverting the signal to be processed, whereby a non-inverted signal can be picked off at output 19.

The signal thus obtained, with a pulse duration corresponding to the duration of the microwave pulse, is furnished to the microwave oscillator via terminals 19 and 20. The microwave oscillator consists of a transistor 25, embodied in the present example as a gallium arsenide field-effect transistor. A suitable bipolar transistor could also be used, however. Furthermore, the inductor is embodied as an inductive TEM line segment. The resonant circuit of oscillator 5 is composed of this line segment 27 and the internal transistor capacitance between gate and drain for FETs, or base and collector for a bipolar transistor. Together with the transistor capacitance, line segment 27 constitutes a series resonant circuit that can be tuned via the length of line 27. The phase condition for the start of oscillation is additionally fulfilled by this. Resistor 26 is required to reduce the Q of the resonant circuit so that a rapid starting of oscillation is guaranteed. A resistor 21 is inserted in the feed line between driver stage 3 and decoupling network 4 to limit the current through transistor 25. Capacitor 23 serves to block the supply voltage and thus decouples the output signal of the oscillator.

Microwave oscillator 5 is designed such that it generates a CW signal upon application of a supply voltage to terminal 20 at the resonant frequency of the determining resonant circuit. In matching the line length of line segment 27, care should be taken to consider the transformed component of the self-inductance of resistor 26 parallel to inductor 27.

As already described, the supply of voltage to the microwave oscillator is accomplished by a pulse of length $t_p$. In order to decouple the pulse-shortening stage and the downstream driver stage 3, it is fed via the decoupling network consisting of a circular stub A and λ/4 line B to microwave oscillator 5.

To achieve a rapid oscillation onset and decay behavior, the source terminal must be connected to ground via a resistor 26. This resistor 26 reduces the Q of the resonant circuit sufficiently that the oscillator has achieved its maximum amplitude after half the pulse length, that is, precisely at the maximum of the pulse amplitude. From there on, the pulse amplitude, and thus also the amplitude of the microwave oscillation, decreases until the pulse amplitude has again reached zero.

The coherence of the microwave oscillation is achieved because the pulse supplying oscillator 5, roughly a nanosecond in duration, has a small rise time in the vicinity of 250 ps and thus already couples a spectral energy component at the resonant frequency into the oscillator. Thus the initial phase of the microwave signal is firmly shaped.

The microwave pulse is decoupled at output 24 of oscillator 5 via capacitor 23. Here, however, the shortened pulse is superimposed on the microwave pulse, but can be removed via a highpass filter. If the microwave pulse that has been created is relayed in a waveguide, however, it is possible to dispense with the additional highpass filter, since the waveguide has the same behavior.

The above-described arrangement permits the shortening of the pulses fed in from pulse generator 1 as adjustable pulse lengths from roughly 0.5 ns up to the length of the input pulses. The adjustment of the pulse length is done by way of ohmic resistor 8 and capacitor 9. The ohmic resistor is embodied here as a trimming potentiometer. Capacitor 9 has a fixed capacitance. The adjustment of trimming potentiometer 8 has thus far been done generally by hand.

Due to the very high frequency components in the operation of the microwave pulse generator, however, the employment of trimming potentiometers is critical. The high-frequency components are caused by the very short rise times of the input signals. Due to the mechanical structure of the arrangement, the parasitic capacitances and inductances of the circuit arrangement are relatively large. The high-frequency components are also scattered to a strong extent. In sum, the entire circuit arrangement thereby becomes particularly sensitive with respect to approach to or touching of the potentiometer.

It has additionally been shown that the manual manipulation of the potentiometer for setting the pulse length when tuning is not optimal in the manufacturing of microwave pulse generators. The hand-tuning of the trimming potentiometer hampers automated manufacturing.

Here is where the present invention takes its start.

The objective of the present invention is viewed as the modification of the previously known circuit arrangement such that, on the one hand, the entire circuit becomes less sensitive to someone approaching and, on the other, there can be automatic tuning, which avoids manual handling of the circuit arrangement.

The problem is solved by a microwave pulse generator with the characteristics of Claim 1.

Refinements are the object of the subordinate claims.

The invention is based essentially on replacing the previously used RC element having a potentiometer with a device that adjusts the amplitude and/or length of the microwave pulses to be generated according to an electronic control signal.

According to a preferred embodiment of the invention, such a device is expediently realized by a fixed resistor and a varicap diode, which changes its capacitance via a voltage applied to the diode.

The essential point in the present invention is that the setting of the microwave pulses is done without a potentiometer.

The device for controlling the amplitude and/or length of the microwave pulses to be generated expediently has a capacitor for DC decoupling of the electronic control signal.

The microwave pulse generator according to the invention can be a component of a sensor device, in which a microprocessor provides an electronic control signal for the pulse-shortening stage by way of an adjustable voltage regulator. The pulse-shortening stage and/or the microwave oscillator is also connected to the microprocessor via a feedback device. The feedback device can be, for instance, a test bench.

Figure 2:
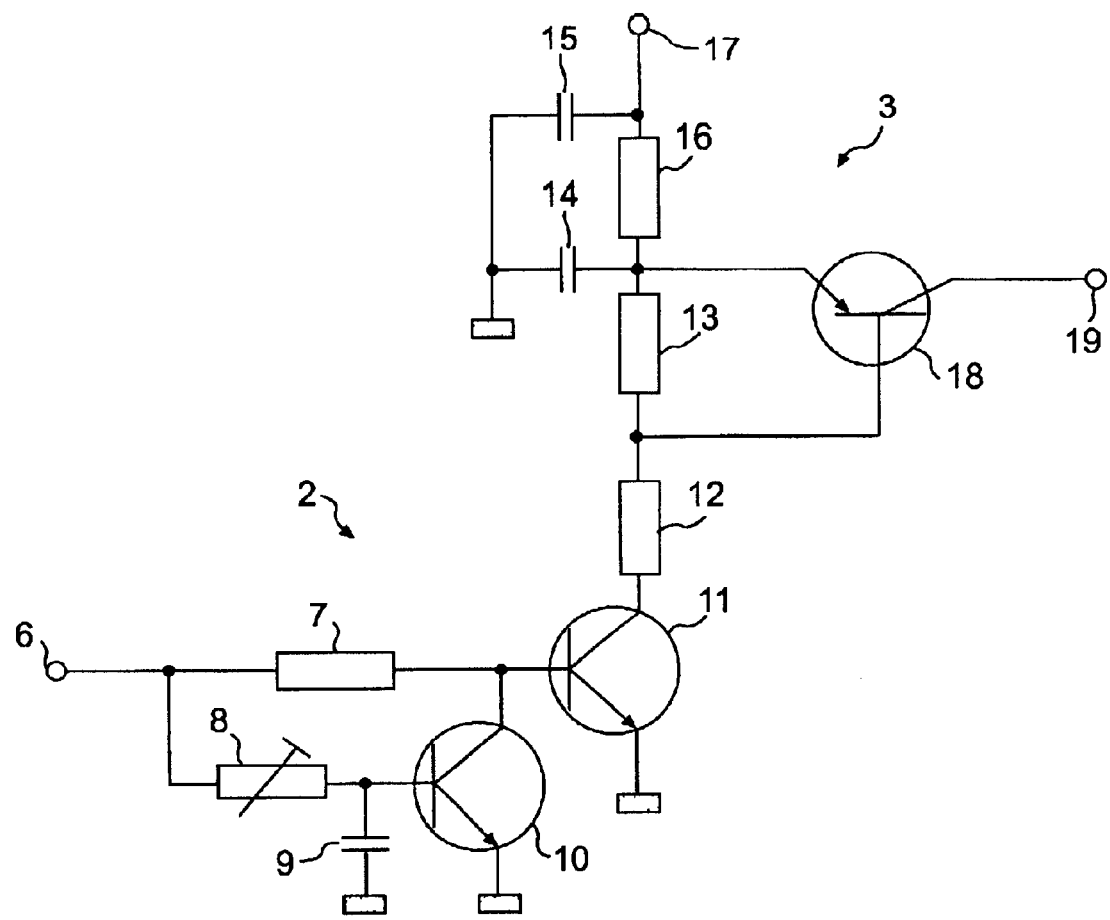
Figure 4:
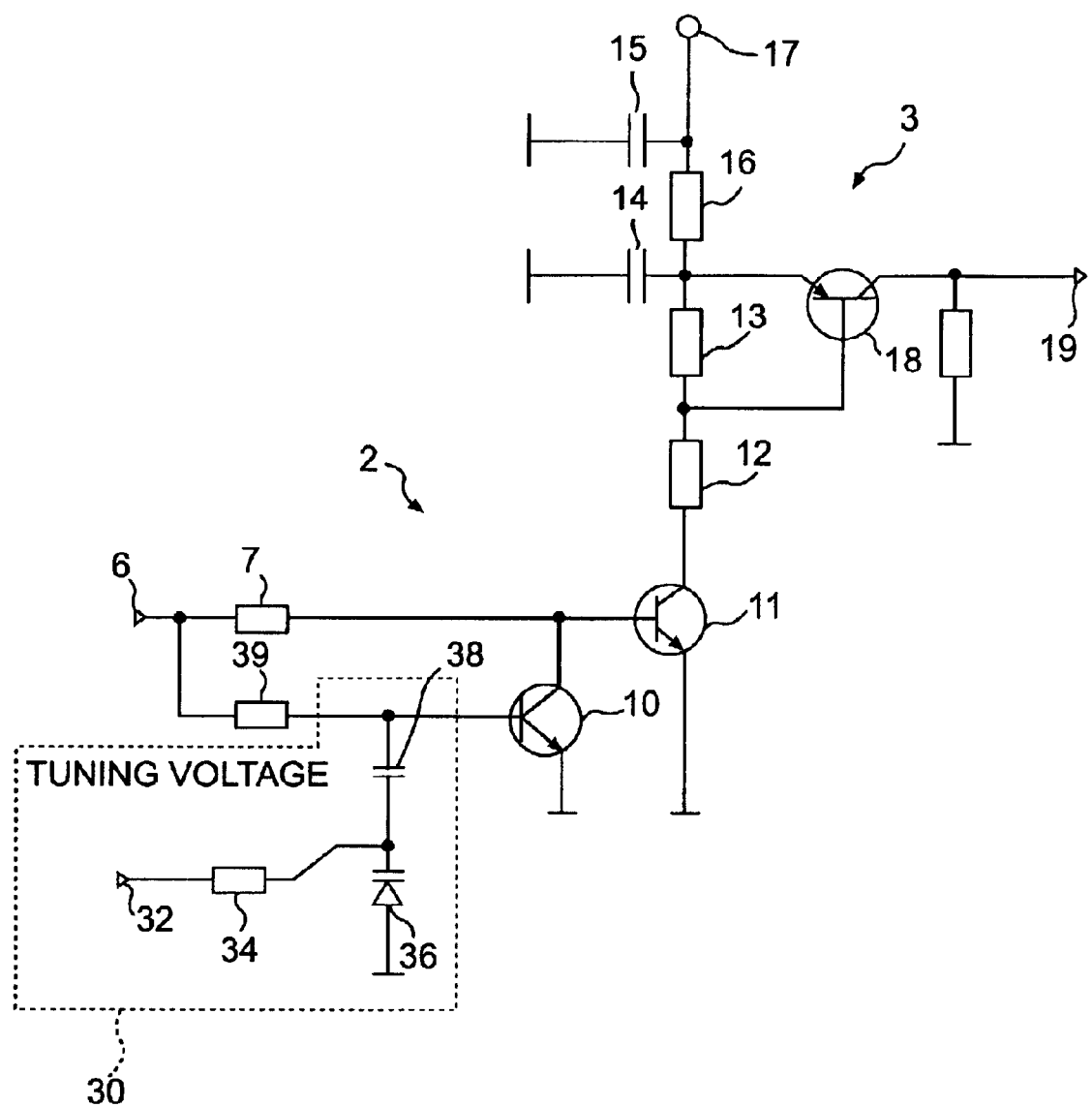
Figure 5:
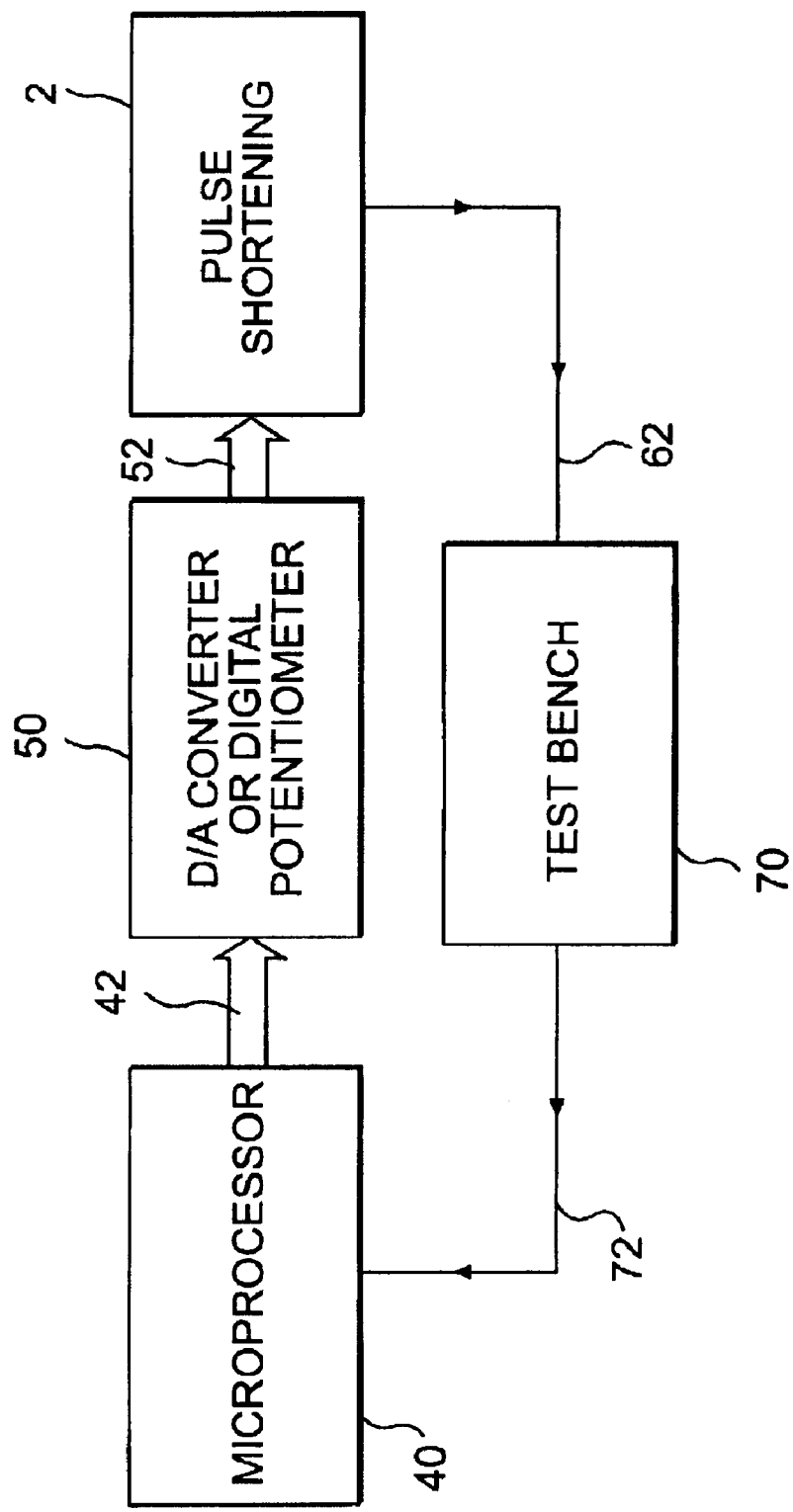
Figure 6:
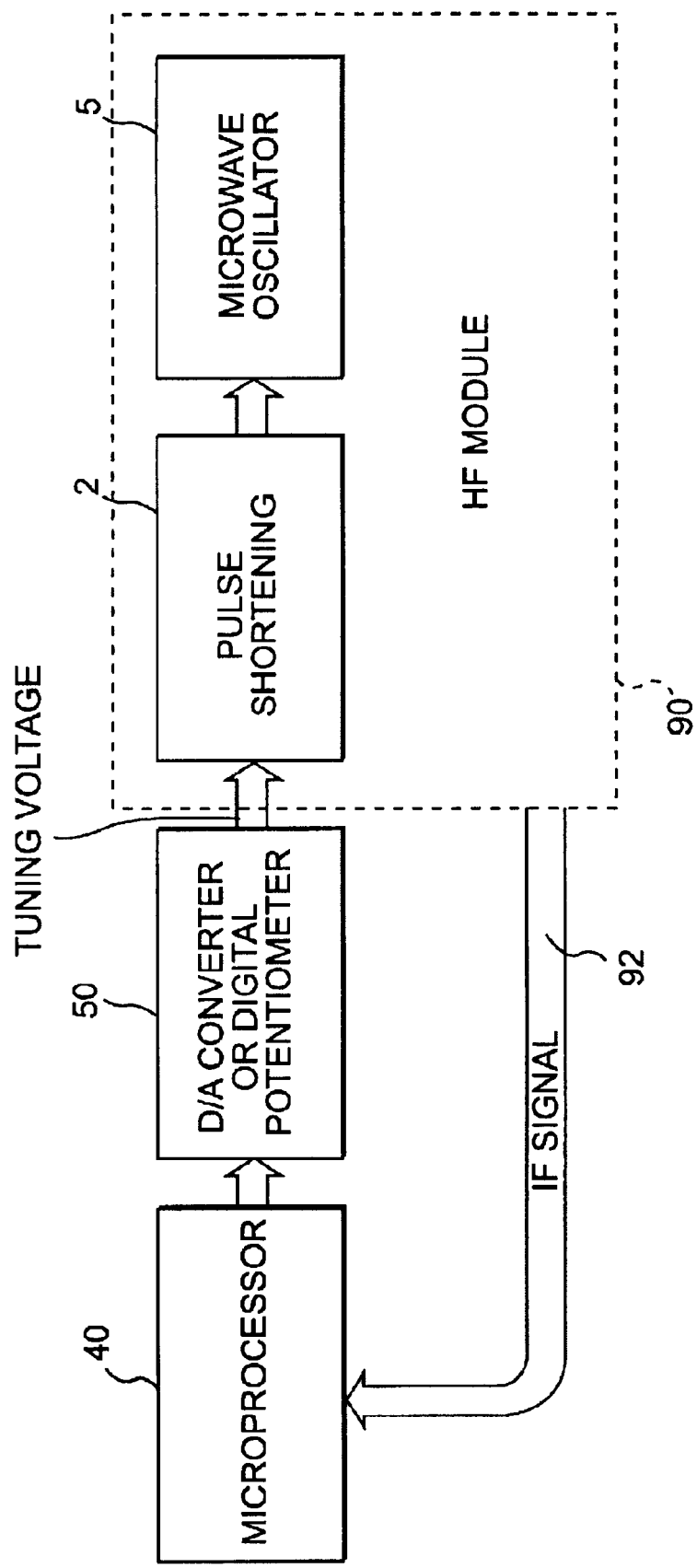

The invention is described in greater detail below on the basis of a concrete embodiment in conjunction with additional figures. Shown are:

FIG. 1, a block circuit diagram of a known arrangement of a microwave pulse generator;

FIG. 2, an embodiment of a known pulse-shortening stage with downstream driver stage;

FIG. 3, a known embodiment of a microwave oscillator;

FIG. 4, a pulse-shortening stage with downstream amplifier according to an embodiment of the present invention;

FIG. 5, a block circuit diagram of a tuning device with a microwave pulse generator; and FIG. 6, a block circuit diagram of a feedback sensor device with a microwave oscillator according to the invention.

The circuit arrangement of a pulse-shortening stage 2 with downstream amplifier 3 as shown in FIG. 4 differs from the circuit arrangement of FIG. 2 only in the driving of transistor 10. The control terminal of transistor 10 is connected via a resistor 39 to input terminal 6. The control terminal of transistor 10 is also connected to reference potential via a capacitor 38 and a varicap diode 36. The varicap diode is biased such that its anode terminal is connected to reference potential and its cathode terminal is connected to capacitor 38. The node point of capacitor 38 and varicap diode 36 is connected via a resistor 34 to an input terminal 32.

An electronic control signal, a tuning signal in the present embodiment, can be applied to this input terminal 32, in order to adjust the amplitude and/or the length of the pulses provided at terminal 6. In contrast to the arrangement consisting of a trimming potentiometer 8 and a capacitor 9 as illustrated in FIG. 2, device 30 consisting of circuitry parts 34, 36 and 38 has the crucial advantage that no manual adjustment is necessary to set the pulse length or amplitude. As a whole, the circuit arrangement is therefore markedly less sensitive to someone approaching. Moreover, the arrangement can be adjusted electronically. Manual intervention is not necessary.

With the arrangement of FIG. 3 [sic; 4] one thus has the possibility of varying the pulse length or amplitude by means of a dc voltage applied externally. The tuning voltage here can be supplied by an adjustable voltage regulator, a digital or conventional potentiometer or a D/A converter. The fast edges of the input pulses need no longer be fed through a potentiometer with large parasitic capacitances and inductances, as was the case in the arrangement of FIG. 2. The electronic control signal, the tuning voltage at terminal 32, for tuning the amplitude or pulse length can be generated further away from the microwave circuit.

The functioning of the circuit arrangement of FIG. 4 is as follows. Pulses with a length of, for instance, 10 ns are applied by pulse generator 1 to resistor 7. Transistor 11 thereby becomes conductive. The pulses applied to resistor 7 are simultaneously supplied via resistor 39 to the control terminal of transistor 10. Together with the series circuit consisting of capacitor 38 and varicap diode 36, resistor 39 constitutes a delay element, which passes the input pulses applied at terminal 6 on to transistor 10 with a delay and thereby blocks it again. The short pulse with a duration of approximately 1 ns which is thus created is inverted at transistor 18, so that this shortened pulse can be picked off at the collector terminal of transistor 18 and thus at terminal 19.

Via resistor 34 of device 30, a tuning voltage for modifying the capacitance can be supplied to varicap diode 36. The pulse length is thereby varied by the tuning voltage in a range from 0.5 ns to the input pulse length. Capacitor 38 serves only for dc decoupling of the tuning voltage and is considerably greater than the maximum capacitance that can be set at varicap diode 36.

During the tuning process, it is possible, for instance, for a pulse measuring device of a test bench 70 to communicate with a microprocessor 40 of a sensing device and to determine a value for the tuning voltage which the microprocessor 40 adjusts via a D/A converter or digital potentiometer 50. This is illustrated in FIG. 5. The individual components are connected together via connection lines 42, 52 as well as 62 and 72. Thus the laborious manual tuning of the transmission pulse that was previously necessary for radar modules is unnecessary.

Another possibility, in which, for instance, the transmission power of the sensor can be raised for large measuring distances or in case of poor reflection characteristics of the filling material in order to achieve a sufficiently high measurement security, is illustrated in FIG. 6. For this purpose the HF module, to which pulse-shortening stage 2 and microwave oscillator 5 belong, is connected via a connection line 92 to microprocessor 40. For example, the transmission power of the sensor can be recorded as a function of the tuning voltage during tuning and stored in a memory of the microprocessor. In case of declining transmission power, the microprocessor then calls up or retrieves a value for the necessary tuning voltage and supplies a control signal to D/A converter 50 so that the tuning voltage is raised appropriately to bring the transmission power back up to the desired value.

List of Reference Characters
1 Pulse generator
2 Pulse-shortening stage
3 Driver stage
4 Decoupling network
5 Microwave oscillator
6 Input terminal
7 Resistor
8 Resistor
9 Capacitor
10 Transistor
11 Transistor
12 Resistor
13 Resistor
14 Decoupling capacitor
15 Decoupling capacitor
16 Resistor
17 Supply voltage terminal
18 Transistor
19 Output terminal
20 Supply terminal
21 Resistor
23 Capacitor
24 Output terminal
25 Transistor, semiconductor amplifier
26 Resistor
30 Device
32 Input length
34 Resistor
36 Varicap diode
38 Capacitor
39 Resistor
40 Microprocessor
42 Line
50 D/A converter or digital potentiometer
52 Line
62 Line
70 Test bench
72 Line
90 HF module
92 Line
A Circular stub
B λ/4 line

What is claimed is:

1. Microwave pulse generator for generating microwave pulses in the nanosecond range with a pulse generator (1) and with a pulse-shortening stage (2) to which the pulses of pulse generator (1) can be fed and by which output pulses in the nanosecond range can be generated, and with a microwave oscillator (5) to which the output pulses can be fed to generate microwave pulses, characterized by a device (30) to be subjected to an electronic control signal at an input terminal (32), by which the amplitude and/or the length of the microwave pulses to be generated can be controlled.

2. Microwave pulse generator according to claim 1, characterized in that device (30) is potentiometer-free.

3. Microwave pulse generator according to claim 1, characterized in that device (30) is a component of pulse-shortening stage (2).

4. Microwave pulse generator according to claim 1, characterized in that device (30) has an ohmic arrangement (34) and a varicap diode arrangement (36), wherein a voltage signal to be applied as an electronic control signal (32) to varicap diode arrangement (36) is provided for controlling the capacitance value of varicap diode arrangement (36).

5. Microwave pulse generator according to claim 1, characterized in that varicap diode arrangement (36) is a varicap diode and ohmic arrangement (34) is an ohmic resistor.

6. Microwave pulse generator according to claim 1, characterized in that device (30) has a capacitor (38) for dc decoupling of electronic control signal (32).

7. Microwave pulse generator according to claim 1, characterized in that pulse-shortening stage (2) has
   a first transistor (11), is connected to the control terminal of which the pulses of constant width are supplied and via the load path of which the output pulses are decoupled, and
   a second transistor (10), the load path of which is connected between the control terminal of first transistor (11) and a reference potential and the control terminal is connected via an ohmic resistor (39) to the output of pulse generator (1) and, via device (30), to the terminal for the electronic control signal.

8. Microwave pulse generator according to claim 7, characterized in that the load path of first transistor (11) is connected at one end to the reference potential and at the other to a supply voltage terminal (17) via a resistive divider network (12, 13), and the base-emitter path of a third transistor (18) is connected in parallel to one of the resistors (13) of resistive divider network (12, 13), and the output pulses can be picked off at the collector of third transistor (18).

9. Microwave pulse generator according to claim 7, characterized in that the control terminal of second transistor

(10) is connected via resistor (39) to the output of pulse generator (1) and is connected to reference potential via the series circuit of capacitor (38) and the varicap diode, wherein a node point of this capacitor (38) and the varicap diode is connected via an additional ohmic resistor (40) to a terminal (42) for applying the electrical control signal.

10. Microwave pulse generator according to claim 1, characterized in that a driver stage (3) is inserted between pulse-shortening stage (2) and the microwave oscillator.

11. Microwave pulse generator according claim 1, characterized in that a decoupling stage (4) is inserted between pulse-shortening stage (2) and microwave oscillator (1).

12. Microwave pulse generator according to claim 11, characterized decoupling stage (4) contains a circular stub (A).

13. Microwave pulse generator according to claim 1, characterized in that the electronic control signal is provided by an adjustable voltage regulator, particularly a digital potentiometer or a D/A converter.

14. Sensor device with a microwave oscillator according to claim 1, wherein a microprocessor (42) provides an electronic control signal for pulse-shortening stage (2) via an adjustable voltge regulator (50) and wherein pulse-shortening stage (2) and/or microwave oscillator (5) is connected via a feedback device to microprocessor (40).

15. Sensor device according to claim 14, characterized in that the feedback device is a test bench (70).

16. Sensor device according to claim 14, characterized in that the feedback device provides microprocessor (40) during operation of the sensor with a signal on the instantaneous transmission power, and a memory device is provided, in which the transmission power of the sensor as a function of the electronic control signal is stored, so that the transmission power of the sensor can be increased on this basis if needed.

* * * * *

UNITED STATES PATENT AND TRADEMARK OFFICE
CERTIFICATE OF CORRECTION

PATENT NO. : 6,771,139 B2  Page 1 of 1
DATED : August 3, 2004
INVENTOR(S) : Schultheiss et al.

It is certified that error appears in the above-identified patent and that said Letters Patent is hereby corrected as shown below:

Column 7,
Line 14, after "characterized" insert -- in that --

Signed and Sealed this

Sixteenth Day of November, 2004

JON W. DUDAS
*Director of the United States Patent and Trademark Office*